United States Patent
Kim

(10) Patent No.: US 10,115,920 B2
(45) Date of Patent: Oct. 30, 2018

(54) ORGANIC LIGHT EMITTING DISPLAY DEVICE

(71) Applicant: LG Display Co., Ltd., Seoul (KR)

(72) Inventor: Kwang Hyun Kim, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 152 days.

(21) Appl. No.: 14/570,452

(22) Filed: Dec. 15, 2014

(65) Prior Publication Data

US 2015/0187848 A1 Jul. 2, 2015

(30) Foreign Application Priority Data

Dec. 31, 2013 (KR) .................... 10-2013-0168988

(51) Int. Cl.
*H01L 51/50* (2006.01)
*H01L 51/52* (2006.01)
*H01L 27/32* (2006.01)

(52) U.S. Cl.
CPC ...... *H01L 51/5012* (2013.01); *H01L 27/3211* (2013.01); *H01L 51/5016* (2013.01); *H01L 51/5265* (2013.01); *H01L 51/5064* (2013.01); *H01L 2251/5384* (2013.01)

(58) Field of Classification Search
CPC ......... H01L 2251/5384; H01L 27/3211; H01L 51/5064
See application file for complete search history.

(56) References Cited

U.S. PATENT DOCUMENTS

| | | | |
|---|---|---|---|
| 2005/0186330 A1* | 8/2005 | Kim | H01L 27/3211 427/66 |
| 2011/0210316 A1* | 9/2011 | Kadoma | C07D 403/10 257/40 |
| 2011/0297977 A1* | 12/2011 | Kajimoto | H01L 27/3206 257/89 |
| 2013/0320308 A1 | 12/2013 | Lee et al. | |
| 2014/0117315 A1* | 5/2014 | Kim | H01L 51/0001 257/40 |
| 2014/0284566 A1* | 9/2014 | Yoo | H01L 51/5012 257/40 |
| 2014/0291627 A1* | 10/2014 | Kim | H01L 51/0013 257/40 |

(Continued)

FOREIGN PATENT DOCUMENTS

CN 103456761 A 12/2013

OTHER PUBLICATIONS

Ichikawa et al., "Electron transport with mobility above 10-3 cm2/Vs in amorphous film of co-planar bipyridyl-substituted oxadiazole," 2007, Phys. Stat. Sol. (RRL) 1, No. 1, R37-R39.*

*Primary Examiner* — Shaun Campbell
*Assistant Examiner* — Aneta Cieslewicz
(74) *Attorney, Agent, or Firm* — Birch, Stewart, Kolasch & Birch, LLP

(57) ABSTRACT

An organic light emitting display device including a first electrode defined into red, green and blue sub-pixel regions; a hole injection layer disposed on the first electrode; a first hole transport layer disposed on the hole injection layer; first, second and third organic emission layers arranged on the first hole transport layer opposite to the respective red, green and blue sub-pixel regions; an electron transport layer disposed on the first, second and third organic emission layers; and a second electrode disposed on the electron transport layer. The second organic emission layer opposite to the green sub-pixel region is formed in a stacked structure including first and second hole host layers and a dopant host layer.

14 Claims, 5 Drawing Sheets

(56) References Cited

U.S. PATENT DOCUMENTS

2014/0326970 A1\* 11/2014 Hudson .............. H01L 51/0067
257/40
2015/0034919 A1\* 2/2015 Kim ................... H01L 51/0058
257/40

\* cited by examiner

@ 5.98" HD 300nit panel

| Items | Green | |
|---|---|---|
| Current efficiency [cd/A] | 95 | |
| High temperature reliability evaluation(75°C 240hrs) | −14% | |
| Color coordinates [CIE] | 0.210 | 0.730 |

FIG. 6

@ 5.98" HD 300nit panel

| Items | Green | |
|---|---|---|
| Current efficiency [cd/A] | 105 | |
| High temperature reliability evaluation(75℃ 240hrs) | -8% | |
| Color coordinates [CIE] | 0.210 | 0.730 | though
ORGANIC LIGHT EMITTING DISPLAY DEVICE

The present application claims priority under 35 U.S.C. § 119(a) of Korean Patent Application No. 10-2013-0168988 filed in the Republic of Korea on Dec. 31, 2013 which is hereby incorporated by reference in its entirety.

BACKGROUND

Field of the Invention

The present invention relates to an organic light emitting display device. More particularly, the present invention relates to an organic light emitting display device adapted to enhance light efficiency by forming an organic emission layer with separately stacked hole host layers and dopant host layers.

Description of the Related Art

An organic light emitting diode used in an organic light emitting display device is a self-luminous element which includes an emission layer formed between two electrodes. The organic light emitting diode generates excitons by injecting electrons and holes into the emission layer through an electron injection electrode (i.e., a cathode) and a hole injection electrode (i.e., an anode) and recombining the electrons and the holes within the emission layer. Also, the organic light emitting diode emits light when the excitons are transitioned from an excited state into a ground state.

Organic light emitting display devices using organic light emitting diodes are classified into a top-emission mode, a bottom-emission mode and a dual-emission mode according to the light emission directions. Also, organic light emitting display devices can be divided into a passive matrix type and an active matrix type.

In order to display an image, an organic light emitting display device can apply scan signals, data signals and supply voltages to a plurality of sub-pixels, which are arranged in a matrix shape, and enable selected sub-pixels to emit light.

Also, in order to enhance luminous efficiency and color coordination of a display panel, an organic light emitting display device with a micro-cavity structure is being proposed which allows red, green and blue sub-pixels to be formed differently from one another with different thicknesses.

FIG. 1 is a cross-sectional view illustrating electric potential levels for a green sub-pixel of an organic light emitting display device according to the related art. FIG. 2 is a table illustrating characteristics of the green organic light emitting diode shown in FIG. 1.

The organic light emitting diode shown in FIG. 1 corresponds to an organic electronic element which converts electrical energy into light energy. Such an organic light emitting diode includes an organic emission layer EML interposed between an anode electrode E1 and a cathode electrode E2, which is configured to emit light. The anode electrode E1 is used to inject holes, and the cathode electrode E2 is used to inject electrons.

The electrons and the holes injected from the two electrodes E1 and E2 are drifted into the organic emission layer EML and form excitons. The electrical energies of the excitons are converted into visible light so that visible light is emitted. In order to easily and smoothly inject the electrons and the holes from the two electrodes E1 and E2 into the organic emission layer EML, a first hole transport layer HTL and a second hole transport layer G'HTL are formed between the organic emission layer EML and the anode electrode E1, and an electron transport layer ETL and an electron injection layer are formed between the organic emission layer EML and the cathode electrode E2. Moreover, a hole injection layer HIL can be formed between the first hole transport layer HTL and the anode electrode E1.

The organic emission layer EML is formed from a phosphorescent material which is obtained by mixing host materials and a dopant material. The host materials include an E-type host material used to transport the electrons and an H-type host material used to transport the holes. The E-type host material has superior transportation capability compared to the H-type host material. Due to this, the electrons and the holes are not efficiently recombined with each other.

Particularly, light leakage and a fault, such as an emission region shift, can be generated in an interfacial surface between the organic emission layer EML and the second hole transport layer G'HTL.

As shown in FIG. 1, the triplet potential energy T1 of the organic emission layer EML is larger than the triplet potential energy T1 of the electron transport layer. Due to this, energy loss must be generated. As seen from characteristics of an element within the green sup-pixel region which are described in FIG. 2, the current efficiency is about 95 (cd/A) and the current efficiency reduction at the high temperature driving reliability evaluation is about −14%.

BRIEF SUMMARY

Accordingly, embodiments of the present invention are directed to an organic light emitting display device that substantially obviates one or more of problems due to the limitations and disadvantages of the related art.

The embodiments of the invention can provide an organic light emitting device which is adapted to enhance light efficiency and prevent a fault of the emission region shift by forming a green organic emission layer, which includes a separately stacked hole host layer and dopant layer, in a green sub-pixel region.

Also, the embodiments of the invention can provide an organic light emitting device which is adapted to enhance light efficiency and prevent a fault of the emission region shift by forming red, green and blue organic emission layers, which each include separately stacked hole host layers and dopant layers, in red, green and blue sub-pixel regions.

Additional features and advantages of the embodiments of the invention will be set forth in the description which follows, and in part will be apparent from the description, or may be learned by practice of the embodiments. The advantages of the embodiments of the invention will be realized and attained by the structure particularly pointed out in the written description and claims hereof as well as the appended drawings.

In order to solve the above-mentioned problems of the related art, an organic light emitting display device according to an embodiment of the invention includes: a first electrode defined into red, green and blue sub-pixel regions; a hole injection layer disposed on the first electrode; a first hole transport layer disposed on the hole injection layer; first, second and third organic emission layers arranged on the first hole transport layer opposite to the respective red, green and blue sub-pixel regions; an electron transport layer disposed on the first, second and third organic emission layers; and a second electrode disposed on the electron transport layer, wherein the second organic emission layer opposite to the green sub-pixel region is formed in a stacked structure including first and second hole host layers and a dopant host layer.

An organic light emitting display device according to an embodiment of the invention includes: a first electrode defined into red, green and blue sub-pixel regions; a hole injection layer disposed on the first electrode; a first hole transport layer disposed on the hole injection layer; first, second and third organic emission layers arranged on the first hole transport layer opposite to the respective red, green and blue sub-pixel region; an electron transport layer disposed on the first, second and third organic emission layers; and a second electrode disposed on the electron transport layer, wherein the first organic emission layer opposite to the red sub-pixel region is formed in a stacked structure including first and second red hole host layers and a red dopant host layer.

Other systems, methods, features and advantages will be, or will become, apparent to one with skill in the art upon examination of the following figures and detailed description. It is intended that all such additional systems, methods, features and advantages be included within this description, be within the scope of the present invention, and be protected by the following claims. Nothing in this section should be taken as a limitation on those claims. Further aspects and advantages are discussed below in conjunction with the embodiments of the invention, It is to be understood that both the foregoing general description and the following detailed description of the present invention are explanatory and are intended to provide further explanation of the invention as claimed.

BRIEF DESCRIPTION OF THE DRAWINGS

The accompanying drawings, which are included to provide a further understanding of the embodiments of the invention and are incorporated herein and constitute a part of this application, illustrate embodiment(s) of the present invention and together with the description serve to explain the invention. In the drawings:

FIG. 6 is a table illustrating characteristics of the green organic light emitting diode shown in FIGS. 3.

DETAILED DESCRIPTION OF THE EMBODIMENTS

Figures 1, 2:
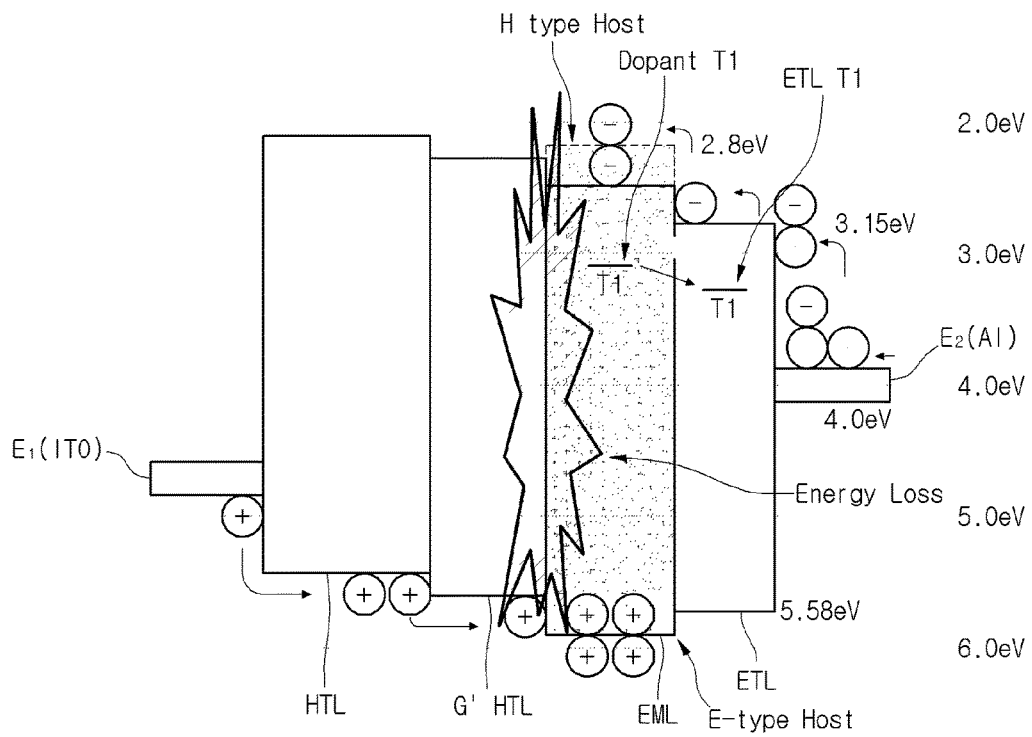
FIG. 1 is a cross-sectional view illustrating electric potential levels for a green sub-pixel region of an organic light emitting display device according to the related art.
FIG. 2 is a table illustrating characteristics of the green organic light emitting diode shown in FIG. 1.

Reference will now be made in detail to the embodiments of the present invention, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be exaggerated for the sake of convenience in the drawings. Wherever possible, the same reference numbers will be used throughout this invention including the drawings to refer to the same or like parts.

The organic light emitting display device according to an embodiment of the present invention includes a timing controller, a data driver, a scan driver and a display panel.

The timing controller receives a vertical synchronous signal, a horizontal synchronous signal, a data enable signal, a clock signal and a data signal from an external system such as an image processor. Also, the timing controller controls operational timings of the data driver and the scan driver using the timing signals such as the vertical synchronous signal, the horizontal synchronous signal, the data enable signal, the clock signal and so on.

The data driver samples the data signal applied from the timing controller and latches the sampled data signal, in response to data timing control signals applied from the timing controller. As such, a serial data signal can be converted into a parallel data signal. Also, the data driver converts the parallel digital data signal into analog data signals using gamma reference voltages. The converted analog data signals are applied from the data driver to sub-pixels on the display panel through data lines.

The scan driver sequentially generates scan signals in response to gate timing control signals. Also, the scan driver applies the scan signals to the sub-pixels on the display panel through scan lines.

The display panel includes the sub-pixels arranged in a matrix shape. The sub-pixels can include red, green and blue sub-pixels, Alternatively, the sub-pixels can include white sub-pixels and a color conversion layer configured to convert white lights emitted from the white sub-pixels into red, green and blue lights. Also, the sub-pixels can be configured in one of a passive type and an active type. For example, the active type sub-pixel includes: a switching transistor configured to transfer a data signal in response to a scan signal; a capacitor configured to store a data voltage corresponding to the data signal; a driving transistor configured to generate a driving current corresponding to the data voltage; and an organic light emitting diode configured to emit light corresponding to the driving current. Thus, the active type sub-pixel can be configured in a 2T1C (two transistors and one capacitor) structure which includes the switching transistor, the driving transistor, the capacitor and the organic light emitting diode. Alternatively, the active type sub-pixel can be configured to further include at least one transistor and at least one capacitor as one of a 3T1C structure, a 4T2C structure, or a 5T2C structure and so on. Moreover, the sub-pixels can be formed in one of a top-emission mode, a bottom-emission mode and a dual-emission mode according to its light emitting direction.

In order to enhance luminous efficiency and color coordination, the sub-pixels included in the display panel are formed in a micro-cavity structure and a stack structure. The sub-pixels with the micro-cavity structure and the stack structure will now be described in detail.

Figure 3:
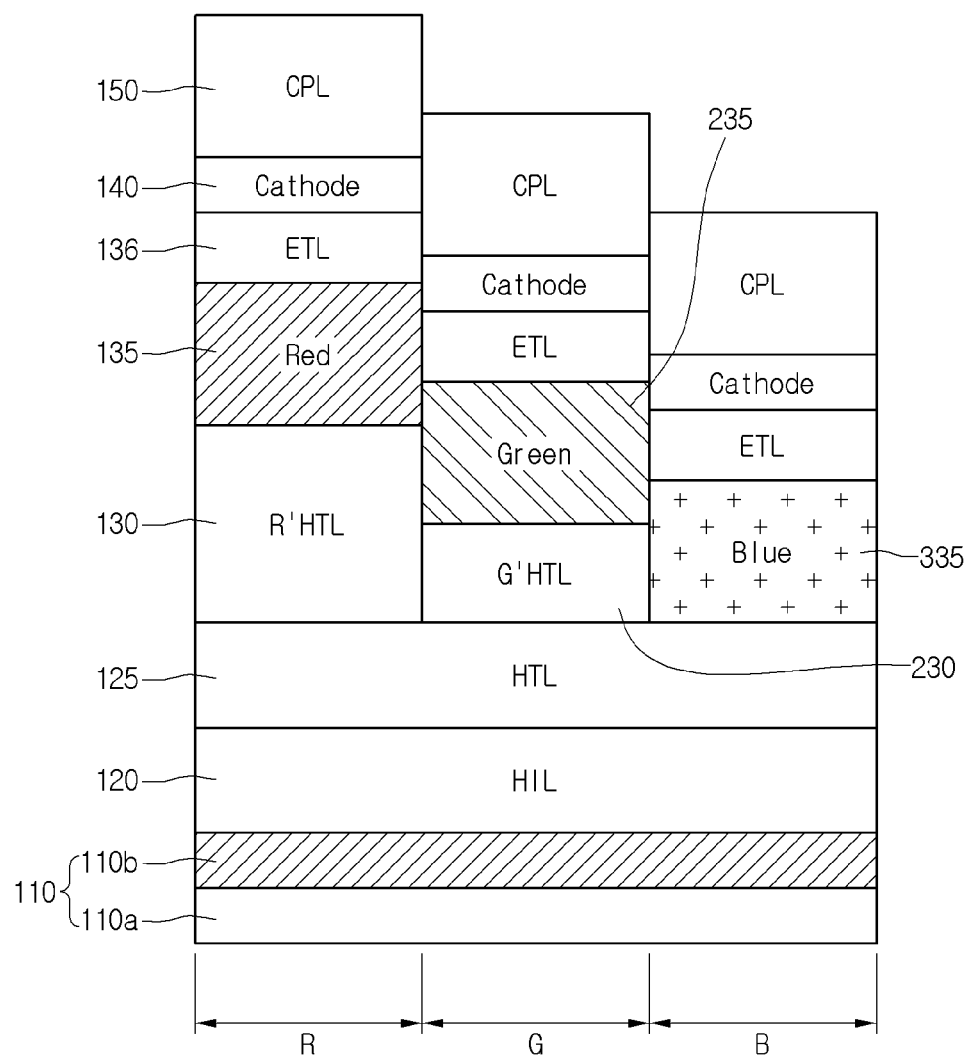
FIG. 3 is a cross-sectional view showing the structure of an organic light emitting display device according to a first embodiment of the present invention.
Figure 4:
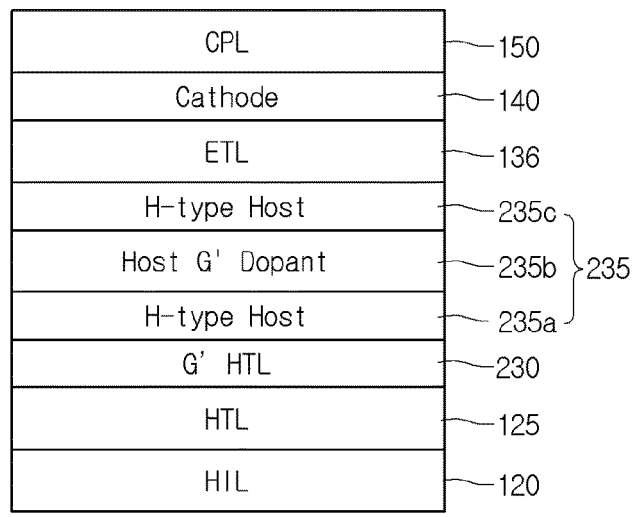
FIG. 4 is a cross-sectional view showing the structure of a green sub-pixel region of an organic light emitting display device according to a first embodiment of the present invention.

FIG. 3 is a cross-sectional view showing the structure of an organic light emitting display device according to a first embodiment of the present invention. FIG. 4 is a cross-sectional view showing the structure of a green sub-pixel region of an organic light emitting display device according to a first embodiment of the present invention.

Referring to FIGS. 3 and 4, the organic light emitting display device according to a first embodiment of the present invention includes a first electrode 110 formed on a substrate, which is defined into red, green and blue sub-pixel regions, and used as a reflective electrode. Also, the organic light emitting display device includes a hole injection layer 120 and a first hole transport layer (HTL) 125 stacked on the first electrode 110 opposite to the red, green and blue sub-pixel regions.

The first electrode 110 can be used as an anode electrode of an organic light emitting diode. Also, the first electrode 110 can be formed by stacking a transparent conductive material layer on a metal layer that has high reflectance. The metal layer 110a can be formed from one of aluminum Al and silver Ag. The transparent conductive material layer 110b can be formed from one of ITO (indium tin oxide) and IZO (indium zinc oxide).

The hole injection layer 120 can be formed from a material selected from a group which includes arylamine based materials, such as NATA, 2T-NATA and NPNPB, and p-doped materials such as F4-TCNQ and PPDN, but it is not limited to this.

The first hole transport layer (HTL) 125 can be formed from a material selected from a group of arylamine based compounds, starburst-aromatic-amine-based-materials, spiro-ladder type materials, NPD (N,N-dinaphthyl-N,N'-diphenyl benzidine), s-TAD and MTDATA (4,4',4''-tris(N-3-methylphenyl-N-phenyl-amino)-triphenylamine), but it is not limited to this. The arylamine-based materials can include TPD (N,N'-bis-(3-methylphenyl)-N,N'-bis-(phenyl)-benzidine), PPD, TTBND, FFD, p-dmDPS and TAPC. The starburst-aromatic-amine-based materials can include TCTA, PTDATA, TDAPB, TDBA, 4-a and TCTA. The spiro-ladder type materials can include spiro-TPD, spiro-mTTB and spiro-2.

A second hole transport layer (R'HTL) 130 and a third hole transport layer (G'HTL) 230 can be formed on the first hole transport layer (HTL) 125 opposite to the red and green sub-pixel regions among the red, green and blue sub-pixel regions. As needed, secondary hole transport layers (R'HTL, G'HTL and B'HTL) can be discriminately formed from one another on the first hole transport layer (HTL) 125 opposite to the red, green and blue sub-pixel regions.

First through third organic emission layers 135, 235 and 335 are formed on the second and third hole transport layers 130 and 230 opposite to the red and green sub-pixel regions and the first hole transport layer 125 opposite to the blue sub-pixel region. The first through third organic emission layers 135, 235 and 335 can be formed from a material which emits visible light by receiving holes and electrons and recombining the holes and the electrons.

The first through third organic emission layers 135, 235 and 335 can be distinguished into red, green and blue emission layers formed opposite to the red, green and blue sub-pixel regions. Also, the first through third organic emission layers 135, 235 and 335 can be formed differently from one another in thickness.

The emission layers 135, 235 and 335 can be formed from materials which are well-known in the art field of the present invention. For example, the emission layers 135, 235 and 335 can be formed from materials with superior fluorescence or phosphorescence quantum efficiency.

Also, the emission layers 135, 235 and 335 can contain a phosphorescent dopant, a hole host material with hole transportation capability and an electron host material with electron transportation capability.

The hole host material with the hole transportation capability can include a carbazole-based host material, a triazine-based host material and so on. Also, the hole host material with the hole transportation capability can include an arylamine-based host material, such as α-NPD or TPD, and a starburst aromatic amine host material such as TDAPB or TCTA. Moreover, the hole host material with the hole transportation capability can include a spiro-ladder type host material such as spiro—TAD or OTP-1. Furthermore, the hole host material with the hole transportation capability can be in a hole mobility range of about 10-3~10-6 $cm^2$/Vs.

The electron host material with the electron transportation capability can include a carbazole-based host material, a triazine-based host material and so on. Also, the electron host material with the electron transportation capability can include organometallic compounds, sulfone derivatives, oxazole derivatives, triazole derivatives, silole derivatives containing bipyridyl, phenylbenzimidazole-based compounds and pyrene derivatives. Also, the electron host material with the electron transportation capability can be in an electron mobility range of about 10-3~10-6 $cm^2$/Vs.

As a detailed example of the emission layers, the red emission layer (i.e., the first emission layer) 135 can be formed from a host material, which contains one of CBP (carbazole biphenyl) and mCP (1,3-bis(carbazol-9-yl), and a phosphorescent material containing at least one material selected from a dopant material group which includes PIQIr (acac) (bis(1-phenylisoquinoline)acetylacetonate iridium), PQIr(acac) (bis(1-phenylquinoline)acetylacetonate iridium), BtP2Ir(acac), PQIr (tris(1-phenylquinoline)iridium) and PtOEP (octaethylporphyrin platinum). However, the red emission layer is not limited to this. Alternatively, the red emission layer can include a fluorescent material containing one of PBD:Eu(DBM)3(Phen) and perylene, instead of the above-mentioned phosphorescent material.

The green emission layer corresponding to the second organic emission layer 235 can be formed from a host material, which contains one of CLIP and mCP, and a phosphorescent material containing a dopant such as Ir(ppy)3 (fac-tris(2-phenylpyridine)iridium), Ir(ppy)2(acac) or Ir(mpyp)3. Alternatively, the green emission layer can include a fluorescent material containing Alq3 (tris(8-hydroxyquinolinato)aluminum), instead of the above-mentioned phosphorescent material. However, the green emission layer is not limited to these.

Referring now to FIG. 4, the second organic emission layer 235 disposed in the green sub-pixel region can be formed in a multi-layered structure in which first and second hole host layers 235a and 235c each having electron transportation capability are stacked with a dopant host layer 235b therebetween. The dopant host layer 235b can be formed from a mixture of an electron host material and a dopant material which each have electron transportation capability.

For example, the first hole host layer 235a of the second organic emission layer 235 within the green sub-pixel region can come in surface contact with the third hole transport layer thereunder. Also, the second hole host layer 235c of the second organic emission layer 235 can come in surface contact with an electrode transport layer 136 above it.

The blue emission layer corresponding to the third organic emission layer 335 can be formed from a host material, which contains one of CBP and mCP, and a phosphorescent material containing a dopant material such as (4,6-F2ppy)2Irpic, (F2ppy)2Ir(tmd) or Ir(dfppz)3. Alternatively, the blue emission layer 335 can include a fluorescent material containing a material selected from a material group which includes spiro-DPVBi, spiro-6P, distyryl benzene (DSB), distyryl arylene (DSA), PFO-based polymer and PPV-based polymer, instead of the above-mentioned phosphorescent material. However, the blue emission layer 335 is not limited to these.

An electron transport layer (ETL) 136 can be formed on the first through third organic emission layers 135, 235 and 335. The electron transport layer 136 can be formed to include an electron injection layer (EIL).

Such an electron transport layer 136 can be used to easily and smoothly transport electrons. The electron transport layer 136 can be formed from at least one material selected from a material group which includes Alq3 (tris(8-hydroxyquinolinato)aluminum), PBD, TAZ, spiro-PBD, BAlq and SAlq, but it is not limited to this.

A second electrode 140 can be formed on the electron transport layer 136, A capping layer (CPL) 150 can be formed on the second electrode 140.

The second electrode 140 can be used as a cathode electrode. Also, the second electrode 140 can be formed from a material with a low work function, superior conductivity and low resistance. In more detail, the second electrode 140 can be formed from one of an alkali metal corresponding to a first group in the periodic table, an alkali earth metal corresponding to a second group in the periodic table and a transition metal. For example, the second electrode 140 can be formed from one of silver Ag, aluminum Al, magnesium Mg, lithium Li, calcium Ca, lithium fluoride LiF, indium tin oxide ITO, indium zinc oxide IZO and alloys thereof. Also, the second electrode 140 can be formed in a single layer or a multi-layered structure. However, the second electrode 140 is not limited to these.

The capping layer 150 can be formed from a material such as NPD.

Thus, the organic light emitting display device of the present invention can allow the organic emission layer in the green sub-pixel region to be formed by stacking a separate hole host layer and dopant host layer. As such, an emission region shift fault can be eliminated and light efficiency can be enhanced.

Figure 5:
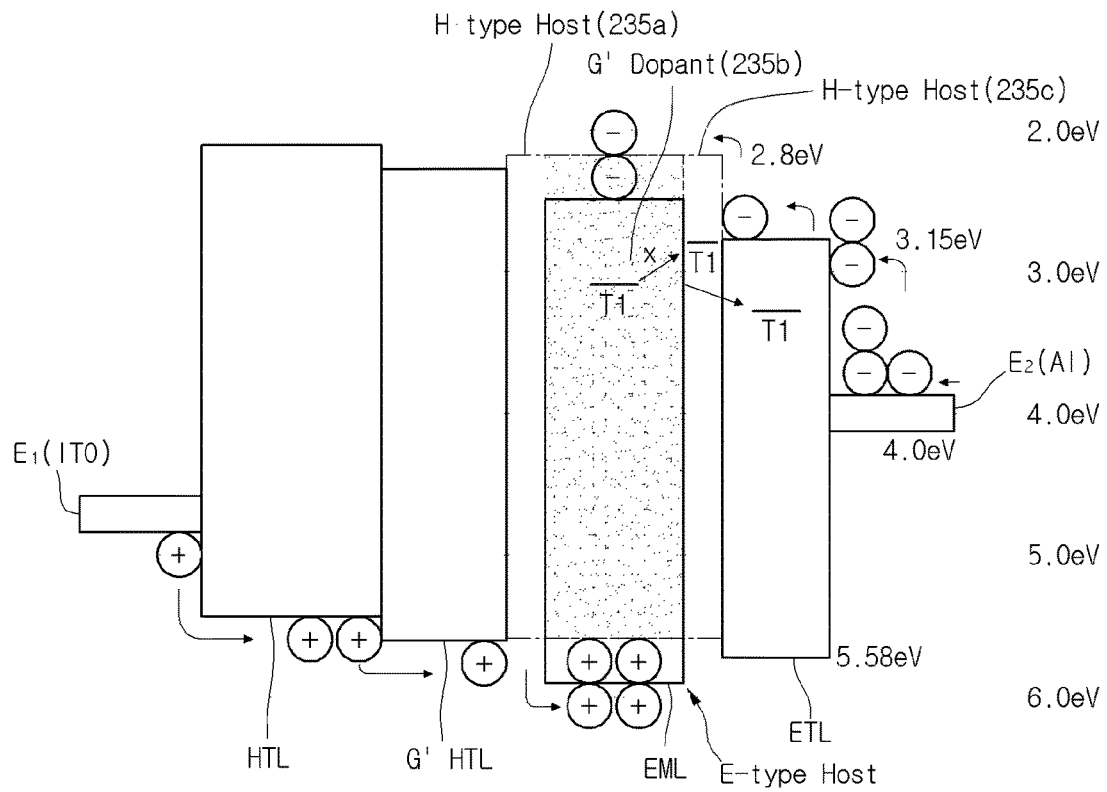
FIG. 5 is a cross-sectional view illustrating electric potential levels for a green sub-pixel region of an organic light emitting display device according to a first embodiment of the present invention.

FIG. 5 is a cross-sectional view illustrating electric potential levels for a green sub-pixel region of an organic light emitting display device according to a first embodiment of the present invention.

Referring to FIG. 5, an organic light emitting diode within a green sub-pixel region includes a first hole transport layer HTL, a second hole transport layer G'HTL, a first hole host layer (H-type host) 235a, a dopant host layer (G' Dopant) 235b, a second hole host layer (H-type host) 235c and an electron transport layer Ell, which are stacked between an anode electrode E1 and a cathode electrode E2. The first hole host layer 235a, the dopant host layer 235b and the second hole host layer 235c can form a green organic emission layer EML.

The dopant host layer 235b can be formed from a mixture of an electron host material and a dopant material.

As shown in the drawing, the dopant host layer (G' Dopant) 235b, the second hole host layer (H-type host) 235c and the electron transport layer ETL have different triplet potential energies T1 from one another. Unlike the related art, the second hole host layer (H-type host) 235c with the triplet potential energy T1 is interposed between the dopant host layer (G' Dopant) 235b and the electron transport layer ETL. As such, energy loss can be reduced. This results from the fact that the second hole host layer (H-type host) 235c has a higher triplet potential TI than that of the dopant host layer (G' Dopant) 235b.

Also, the triplet potentials T1 of the first and second hole host layers 235a and 235c are set to be higher than that of the dopant host layer 235b. As such, triplet excitons can be confined within the emission region. in accordance therewith, light efficiency can be enhanced.

Moreover, the first hole host layer (H-type host) 235a exists between the second hole transport layer (G'HTL) and the dopant host layer (G' Dopant) 235b in an interfacial surface shape. Similarly, the second hole host layer (H-type host) 235c exists between the election transport layer ETL and the dopant host layer (G' Dopant) 235b in an interfacial surface shape. As such, light loss caused by the emission region shift fault can be reduced.

FIG. 6 is a table illustrating characteristics of the green organic light emitting diode shown in FIG. 3.

Referring to the characteristic table of FIG. 2, the related art element within the green sub-pixel region has a current efficiency of about 95 cd/A and marks a current efficiency reduction of about −14% at the high temperature driving reliability evaluation.

However, as seen from the characteristic table of FIG. 6, the green light emitting diode of the present invention has a higher current efficiency of about 105 cd/A and marks a lower current efficiency reduction of about −8% at the high temperature driving reliability evaluation, compared to that of the related art.

In accordance therewith, it is evident that the organic light emitting display device of the present invention increases the light efficiency in the green sub-pixel region.

Figure 7:
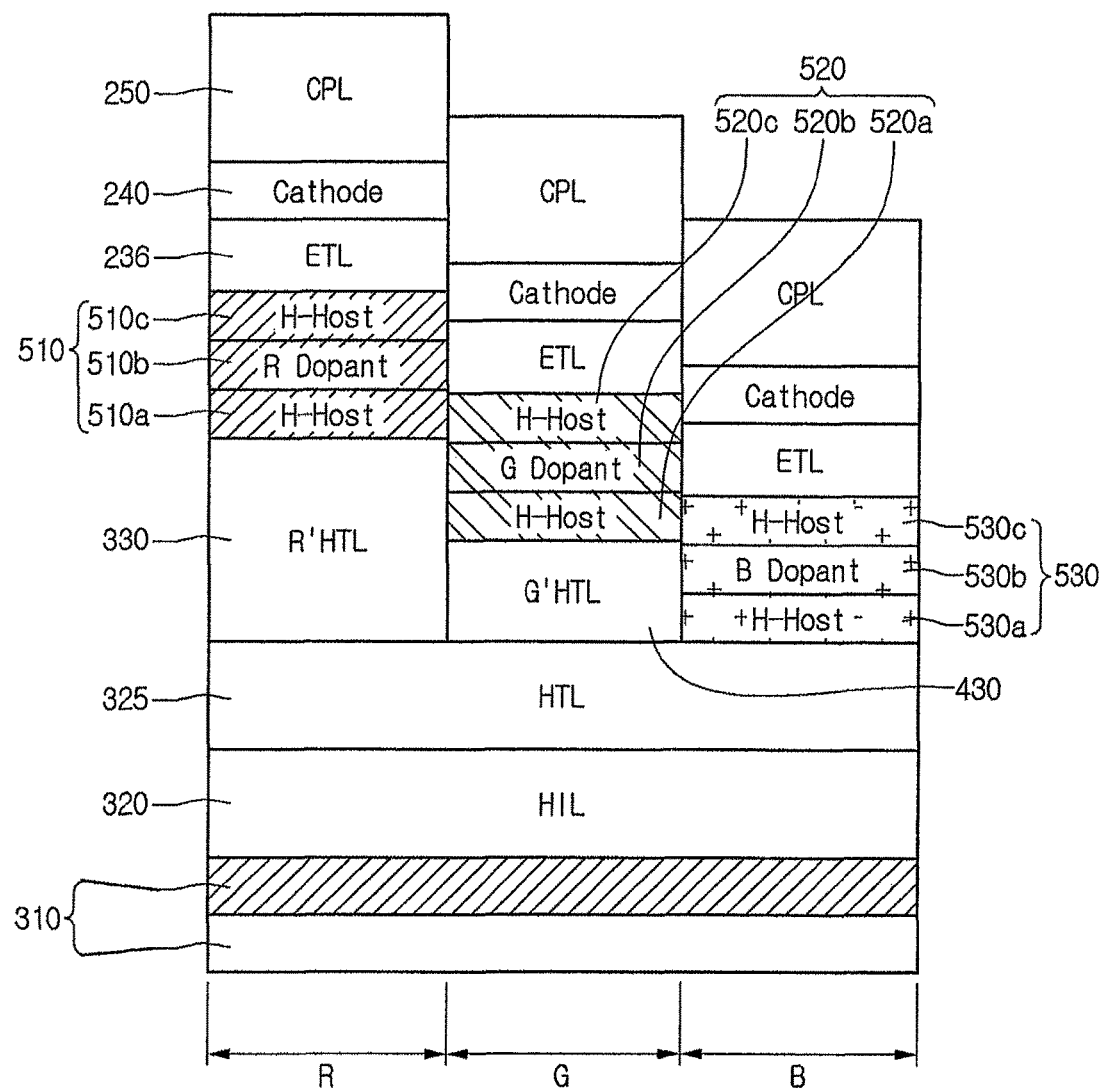
FIG. 7 is a cross-sectional view showing the structure of an organic light emitting display device according to a second embodiment of the present invention.

FIG. 7 is a cross-sectional view showing the structure of an organic light emitting display device according to a second embodiment of the present invention.

The second embodiment of FIG. 7 has the same structure as the first embodiment of FIG. 3, but forms all red, green and blue emission layers in a stacked structure of a first hole host layer, a dopant host layer and a second hole host layer like the green organic emission layer of the first embodiment. The layers of FIG. 7 having the same name as those of FIG. 3 can be formed from the same material as those of the first embodiment without being specified. Components of the second embodiment distinguished from those of the first embodiment will be centrally described.

Referring to FIG. 7, the organic light emitting display device according to a second embodiment of the present invention can allow a first electrode 310 to be formed the entire surface of a substrate which is defined into red, green and blue regions. A first hole injection layer (HIL) 320 and a first hole transport layer (HTL) 325 each opposite to the respective red, green and blue regions are stacked on the first electrode 310.

A second hole transport layer (R'HTL) 330 and a third hole transport layer (G'HTL) 430 can be formed on the first hole transport layer (HTL) 325 opposite to only the red and green sub-pixel regions among the red, green and blue sub-pixel regions. As needed, secondary hole transport layers (R'HTL, G'HTL and B'HTL) can be formed on the first hole transport layer (HTL) 325 opposite to the red, green and blue sub-pixel regions.

First through third organic emission layers 510, 520 and 530 are formed on the second and third hole transport layers 330 and 430 opposite to the red and green sub-pixel regions and the first hole transport layer (HTL) 325 opposite to the blue sub-pixel region. The first through third organic emission layers 510, 520 and 530 can be each formed from a material which emits visible light by receiving holes and electrons and recombining the holes and the electrons.

The first through third organic emission layers 510, 520 and 530 can be distinguished into red, green and blue emission layers formed opposite to the respective red, green and blue sub-pixel regions. Also, the first through third organic emission layers 510, 520 and 530 can be formed differently from one another in thickness.

The emission layers 510, 520 and 530 can be formed from materials which are well-known in the art field of the present invention. For example, the emission layers 510, 520 and 530 can be formed from materials with superior fluorescence or phosphorescence quantum efficiency. For example, the rod emission layer corresponding to the first organic emission layer 510 can be formed from a host material, which contains one of CBP (carbazole biphenyl) and mCP (1,3-bis(carbazol-9-yl), and a phosphorescent material containing at least one selected from a dopant material group which includes PIQIr(acac) (bis(1-phenylisoquinoline)acetylacetonate iridium), PQIr(acac) (bis(1-phenylquinoline)acetylacetonate iridium) BtP2Ir(acac), PQIr (tris(1-phenylquinoline) iridium) and PtOEP (octaethylporphyrin platinum). Alternatively, the red emission layer 510 can include a fluorescent material containing one of PBD:Eu(DBM)3 (Phen) and perylene, instead of the above-mentioned phosphorescent material. However, the red emission layer 510 is not limited to these.

The first organic emission layer 510 disposed in the red sub-pixel region can be formed in a multi-layered structure in which first and second red host layers 510a and 510c each having electron transportation capability are stacked with a red dopant host layer 510b therebetween. The red dopant host layer 510b is formed from a mixture of an electron host material and a dopant material which each have electron transportation capability.

As such, the first red host layer 510a of the first organic emission layer 510 within the red sub-pixel region can come in surface contact with the second hole transport layer 330 thereunder. Also, the second red host layer 510c of the first organic emission layer 510 can come in surface contact with an electrode transport layer 236 above it.

The green emission layer corresponding to the second organic emission layer 520 can be formed from a host material, which contains one of CBP and mCP, and a phosphorescent material containing a dopant material such as Ir(ppy)3 (fac-tris(2-phenylpyridine)iridium), Ir(ppy)2 (acac) or Ir(mpyp)3. Alternatively, the green emission layer 520 can include a fluorescent material containing Alq 3 (tris(8-hydroxyquinolinato)aluminum), instead of the above-mentioned phosphorescent material. However, the green emission layer is not limited to these.

The second organic emission layer 520 disposed in the green sub-pixel region can be formed in a multi-layered structure in which first and second green host layers 520a and 520c each having electron transportation capability are stacked with a green dopant host layer 520b therebetween. The green dopant host layer 520b is formed from a mixture of an electron host material and a dopant material which each have the electron transportation capability.

As such, the first green host layer 520a of the second organic emission layer 520 within the green sub-pixel region can come in surface contact with the third hole transport layer 330 thereunder. Also, the second green host layer 520e of the second organic emission layer 520 can come in surface contact with the electrode transport layer 236 above it.

The blue emission layer corresponding to the third organic emission layer 530 can be formed from a host material, which contains one of CBP and mCP, and a phosphorescent material containing a dopant material such as (4,6-F2ppy)2Irpic, (F2ppy)2Ir(tmd) or Ir(dfppz)3. Alternatively, the blue emission layer 530 can include a fluorescent material containing one selected from a material group which includes spiro-DPVBi, spiro-6P, distyryl benzene (DSB), distyryl arylene (DSA), PFO-based polymer and PPV-based polymer, instead of the above-mentioned phosphorescent material. However, the blue emission layer is not limited to these.

The third organic emission layer 530 disposed in the blue sub-pixel region can be formed in a multi-layered structure in which first and second blue host layers 530a and 530c each having the electron transportation capability are stacked with a blue dopant host layer 530b therebetween. The blue dopant host layer 530b is formed from a mixture of an electron host material and a dopant material which each have electron transportation capability.

In accordance therewith, the first blue host layer 530a of the third organic emission layer 530 within the blue sub-pixel region can come in surface contact with the first hole transport layer 325 thereunder. Also, the second blue host layer 530c of the third organic emission layer 530 can come in surface contact with an electrode transport layer 136 above it.

The electron transport layer (ETL) 236 can be formed on the first through third organic emission layers 510, 520 and 530. Also, the electron transport layer 236 can be formed to include an electron injection layer (EIL).

Such an electron transport layer 236 can be used to easily and smoothly transport the electrons. The electron transport layer 236 can be formed from at least one material selected from a material group which includes Alq3 (tris(8-hydroxyquinolinato)aluminum), PBD, TAZ, spiro-PBD, BAlq and SAlq, but it is not limited to this.

A second electrode 240 can be formed on the electron transport layer 236. A capping layer (CPL) 250 can be formed on the second electrode 240.

The second electrode 240 can be used as a cathode electrode. Also, the second electrode 240 can be formed from a material with a low work function, superior conductivity and low resistance. In more detail, the second electrode 240 can be formed from one of an alkali metal corresponding to a first group in the periodic table, an alkali earth metal corresponding to a second group in the periodic table and a transition metal. For example, the second electrode 240 can be formed from one of silver Ag, aluminum Al, magnesium Mg, lithium Li, calcium Ca, lithium fluoride LiF, indium tin oxide ITO, indium zinc oxide IZO and alloys thereof Also, the second electrode 240 can be formed in a single layer or a multi-layered structure. However, the second electrode 240 is not limited to these.

The capping layer 150 can be formed from a material such as NPD.

As described above, the organic light emitting display device of the present invention can allow the red, green and blue organic emission layers in the respective red, green and blue sub-pixel regions to be formed by stacking separate hole host layers and dopant host layers. As such, an emission region shift fault can be eliminated and light efficiency can be enhanced.

Although the invention has been described with reference to a number of illustrative embodiments thereof it should be understood that numerous other modifications and embodiments can be devised by those skilled in the art that will fall within the spirit and scope of the principles of this invention. More particularly, various variations and modifications are possible in the component parts and/or arrangements of the subject combination arrangement within the scope of the invention, the drawings and the appended claims. In addition to variations and modifications in the component parts and/or arrangements, alternative uses will also be apparent to those skilled in the art.

What is claimed is:

1. An organic light emitting diode display device comprising:
   a common anode electrode disposed on red, green and blue sub-pixel regions as a single electrode and including a metal layer and a transparent conductive material layer on the metal layer;
   a hole injection layer disposed on the common anode electrode;
   a first hole transport layer disposed on the hole injection layer;
   a second hole transport layer disposed on the first hole transport layer opposite to the red sub-pixel region;
   a third hole transport layer disposed on the first hole transport layer opposite to the green sub-pixel region;
   first, second and third organic emission layers arranged over the first hole transport layer opposite to the red, green and blue sub-pixel regions, respectively;
   an electron transport layer disposed on the first, second and third organic emission layers;
   a first cathode electrode on the electron transport layer corresponding to the red sub-pixel region;
   a second cathode electrode on the electron transport layer corresponding to the green sub-pixel region; and
   a third cathode electrode on the electron transport layer corresponding to the blue sub-pixel region,
   wherein the second organic emission layer opposite to the green sub-pixel region is formed in a stacked structure including a green dopant host layer disposed between a first green hole type host layer and a second green hole type host layer used to transport holes,
   wherein the first green hole type host layer of the second organic emission layer is interposed between the green dopant host layer and the third hole transport layer,
   wherein the third organic emission layer opposite to the blue sub-pixel region is formed in a stacked structure including a blue dopant host layer disposed between a first blue hole type host layer and a second blue hole type host layer used to transport holes,
   wherein the second blue hole type host layer of the third organic emission layer is interposed between the blue dopant host layer and the electron transport layer,
   wherein the first, second and third organic emission layers are separate and discriminately formed from one another on the hole injection layer,
   wherein a side of the stacked structure of the second organic emission layer contacts a side of the stacked structure of the third organic emission layer, and
   wherein the first green hole type host layer of the stacked structure of the second organic emission layer is substantially coplanar with the second blue hole type host layer of the stacked structure of the third organic emission layer.

2. The organic light emitting diode display device of claim 1, wherein the second green hole type host layer of the second organic emission layer is interposed between the green dopant host layer and the electron transport layer.

3. The organic light emitting diode display device of claim 1, wherein the second organic emission layer is formed by sequentially stacking the first green hole type host layer, the green dopant host layer and the second green hole type host layer.

4. The organic light emitting diode display device of claim 1, wherein the green dopant host layer of the second organic emission layer includes an electron host material with an electron mobility range of about $10\text{-}3\sim10\text{-}6\ cm^2/Vs$.

5. The organic light emitting diode display device of claim 1, wherein the first, second and third organic emission layers have different thicknesses and are arranged in different planes.

6. An organic light emitting diode display device comprising:
   a common anode electrode disposed on red, green and blue sub-pixel regions as a single electrode and including a metal layer and a transparent conductive material layer on the metal layer;
   a hole injection layer disposed on the common anode electrode;
   a first hole transport layer disposed on the hole injection layer;
   a second hole transport layer disposed on the first hole transport layer opposite to the red sub-pixel region;
   a third hole transport layer disposed on the first hole transport layer opposite to the green sub-pixel region;
   first, second and third organic emission layers arranged on the first hole transport layer opposite to the red, green and blue sub-pixel region, respectively;
   an electron transport layer disposed on the first, second and third organic emission layers;
   a first cathode electrode on the electron transport layer corresponding to the red sub-pixel region;
   a second cathode electrode on the electron transport layer corresponding to the green sub-pixel region; and
   a third cathode electrode on the electron transport layer corresponding to the blue sub-pixel region,
   wherein the first organic emission layer opposite to the red sub-pixel region is formed in a stacked structure including a red dopant host layer disposed between a first red hole type host layer and a second red hole type host layer used to transport holes,
   wherein the second organic emission layer opposite to the green sub-pixel region is formed in a stacked structure including a green dopant host layer disposed between a first green hole type host layer and a second green hole type host layer used to transport the holes,
   wherein the first green hole type host layer of the second organic emission layer is interposed between the green dopant host layer and the third hole transport layer,
   wherein the third organic emission layer opposite to the blue sub-pixel region is formed in a stacked structure including a blue dopant host layer disposed between a first blue hole type host layer and a second blue hole type host layer used to transport the holes,
   wherein the second blue hole type host layer of the third organic emission layer is interposed between the blue dopant host layer and the electron transport layer,
   wherein the first, second and third organic emission layers are separate and discriminately formed from one another on the hole injection layer,
   wherein a side of the stacked structure of the second organic emission layer contacts a side of the stacked structure of the third organic emission layer, and
   wherein the first green hole type host layer of the stacked structure of the second organic emission layer is substantially coplanar with the second blue hole type host layer of the stacked structure of the third organic emission layer.

7. The organic light emitting diode display device of claim 6, wherein the green dopant host layer of the second organic emission layer includes an electron host material with an electron mobility range of about 10-3~10-6 cm$^2$/Vs.

8. The organic light emitting diode display device of claim 6, wherein the first blue hole type host layer of the third organic emission layer is interposed between the blue dopant host layer and the first hole transport layer.

9. The organic light emitting diode display device of claim 6, wherein the third organic emission layer is formed by sequentially stacking the first blue hole type host layer, the blue dopant host layer and the second blue hole type host layer.

10. The organic light emitting diode display device of claim 6, wherein the first red hole type host layer of the first organic emission layer is interposed between the red dopant host layer and the second hole transport layer.

11. The organic light emitting diode display device of claim 6, wherein the second red hole type host layer of the first organic emission layer is interposed between the red dopant host layer and the electron transport layer.

12. The organic light emitting diode display device of claim 6, wherein the first organic emission layer is formed by sequentially stacking the first red hole type host layer, the red dopant host layer and the second red hole type host layer.

13. The organic light emitting diode display device of claim 6, wherein the first, second and third organic emission layers have different thicknesses, and
    wherein each of the red, green and blue dopant host layers is arranged in a different plane.

14. The organic light emitting diode display device of claim 1, wherein triplet potentials of the first and second green hole type host layers are both higher than a triplet potential of the green dopant host layer.

* * * * *